US011697167B2

United States Patent
Reul et al.

(10) Patent No.: US 11,697,167 B2
(45) Date of Patent: Jul. 11, 2023

(54) DEVICE AND METHOD FOR SOLDERING CONTACT ELEMENTS WITH INDUCTION HEAT

(71) Applicant: SAINT-GOBAIN GLASS FRANCE, Courbevoie (FR)

(72) Inventors: Bernhard Reul, Herzogenrath (DE); Cynthia Halm, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 148 days.

(21) Appl. No.: 17/261,741

(22) PCT Filed: Jul. 18, 2019

(86) PCT No.: PCT/EP2019/069393
§ 371 (c)(1),
(2) Date: Jan. 20, 2021

(87) PCT Pub. No.: WO2020/016367
PCT Pub. Date: Jan. 23, 2020

(65) Prior Publication Data
US 2021/0291286 A1 Sep. 23, 2021

(30) Foreign Application Priority Data
Jul. 20, 2018 (EP) .................................... 18184600

(51) Int. Cl.
*B23K 3/00* (2006.01)
*B23K 1/00* (2006.01)
(Continued)

(52) U.S. Cl.
CPC ............ *B23K 1/002* (2013.01); *B23K 1/0016* (2013.01); *B23K 3/0475* (2013.01); *B23K 3/087* (2013.01);
(Continued)

(58) Field of Classification Search
CPC .... B23K 1/002; B23K 1/0016; B23K 3/0475; B23K 3/087; B23K 2101/36;
(Continued)

(56) References Cited

U.S. PATENT DOCUMENTS 6,307,515 B1 * 10/2001 Sauer .................... H01R 13/20
343/711
9,595,768 B2 * 3/2017 Lyon .................... B23K 35/001
(Continued)

FOREIGN PATENT DOCUMENTS

CN  101704143 A  5/2010
CN  103347644 A  10/2013
(Continued)

OTHER PUBLICATIONS

International Search Report as issued in International Patent Application No. PCT/EP2019/069393, dated Sep. 30, 2019.
(Continued)

*Primary Examiner* — Kiley S Stoner
(74) *Attorney, Agent, or Firm* — Pillsbury Winthrop Shaw Pittman LLP

(57) ABSTRACT

A device for inductively soldering at least one ferromagnetic contact element to at least one conductor structure on a nonmetallic plate, includes a system for fastening a plate during the soldering operation, at least one soldering tool having at least one induction loop or induction coil suitable for emitting a magnetic field, a system for mutually positioning the soldering tool and the contact element such that the switched-on magnetic field of the soldering tool reliably heats the ferromagnetic contact element and thus the solder joint, a generator that is suitable for generating an alternating voltage with a frequency of up to 1500 kHz and that can be connected to the induction loop or induction coil.

14 Claims, 2 Drawing Sheets

Figure 1:
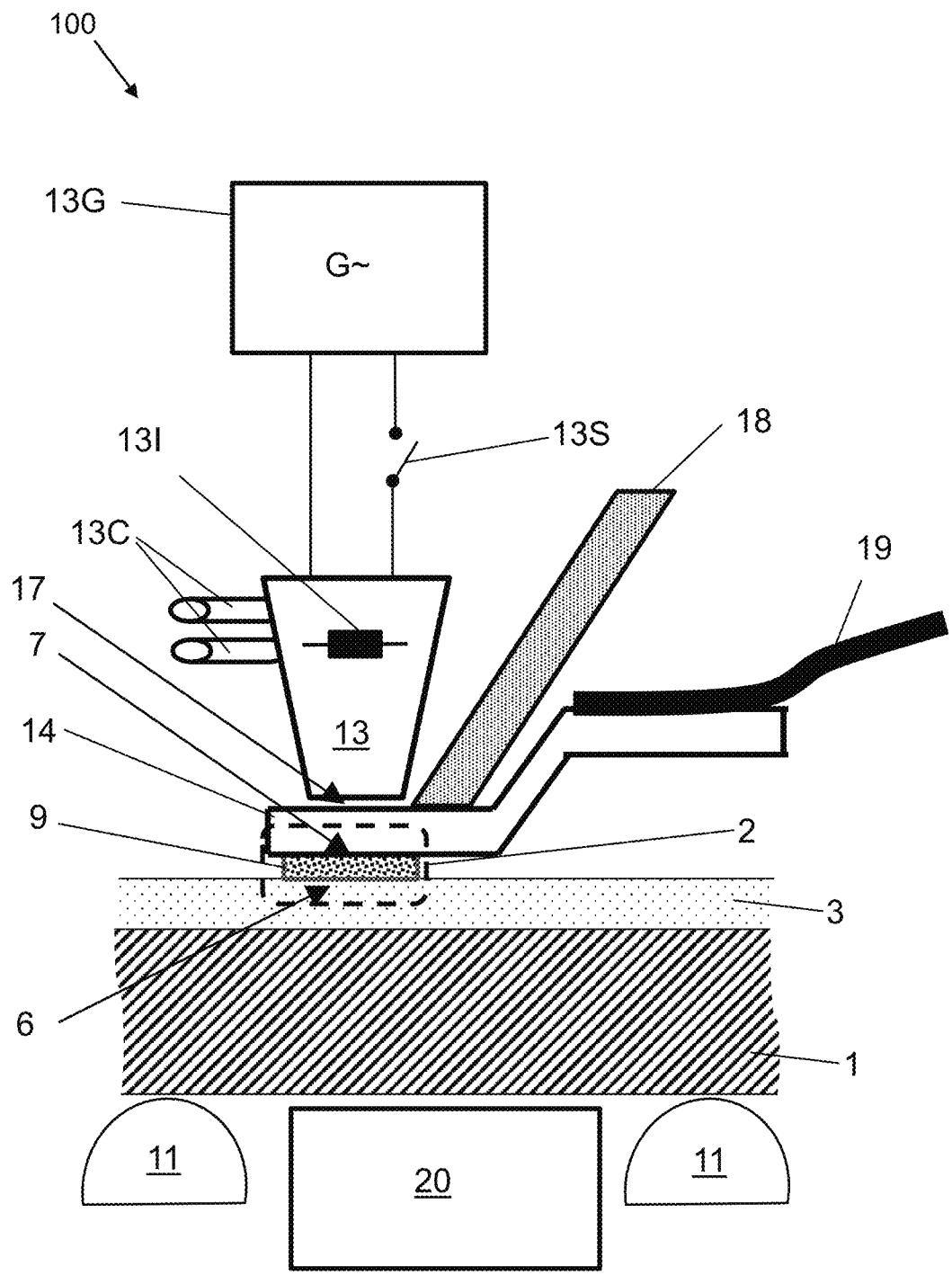

(51) Int. Cl.
  *B23K 1/002* (2006.01)
  *H05K 3/34* (2006.01)
  *B23K 3/047* (2006.01)
  *B23K 3/08* (2006.01)
  *B23K 101/36* (2006.01)

(52) U.S. Cl.
  CPC ........ *H05K 3/3485* (2020.08); *B23K 2101/36* (2018.08)

(58) Field of Classification Search
  CPC .... B23K 3/0623; B23K 13/01; H05K 3/3485; H05B 3/84; H05B 6/101; H05B 6/14; H05B 6/40; H05B 2203/016; H05B 2203/017; H05B 6/42; H01R 43/0207
  USPC .................................................. 219/615–616
  See application file for complete search history.

(56) References Cited

U.S. PATENT DOCUMENTS

| | | | | |
|---|---|---|---|---|
| 10,357,840 | B2* | 7/2019 | Gleisberg | B23K 35/0238 |
| 10,835,979 | B2* | 11/2020 | Pagel | B23K 3/026 |
| 10,974,334 | B2* | 4/2021 | Roger | B23K 3/0338 |
| 2006/0292380 | A1* | 12/2006 | Mann | B32B 17/10174 |
| | | | | 428/426 |
| 2007/0105341 | A1 | 5/2007 | Sosnowchik et al. | |
| 2007/0224842 | A1* | 9/2007 | Hoepfner | H05B 3/84 |
| | | | | 439/34 |
| 2010/0326983 | A1* | 12/2010 | Sitterlet | B23K 1/0008 |
| | | | | 219/635 |
| 2011/0062148 | A1* | 3/2011 | Kumaria | B23K 1/002 |
| | | | | 219/616 |
| 2014/0183181 | A1* | 7/2014 | Ash | B23K 1/002 |
| | | | | 219/616 |
| 2015/0048078 | A1* | 2/2015 | Morf | B23K 1/002 |
| | | | | 219/616 |
| 2015/0236431 | A1* | 8/2015 | Schmalbuch | H01R 4/183 |
| | | | | 174/250 |
| 2016/0183330 | A1* | 6/2016 | Sigl | H05B 6/40 |
| | | | | 219/677 |
| 2019/0002338 | A1* | 1/2019 | Furuhashi | B60S 1/02 |
| 2021/0276112 | A1* | 9/2021 | Reul | B23K 3/08 |

FOREIGN PATENT DOCUMENTS

| | | |
|---|---|---|
| CN | 107073617 A | 8/2017 |
| DE | 10 2004 057630 B3 | 3/2006 |
| DE | 10 2015 003086 A1 | 3/2016 |
| GB | 2139537 A * | 11/1984 |

OTHER PUBLICATIONS

First Office Action as issued in Chinese Patent Application No. 201980001714.5, dated Sep. 27, 2021.

* cited by examiner

DEVICE AND METHOD FOR SOLDERING CONTACT ELEMENTS WITH INDUCTION HEAT

CROSS-REFERENCE TO RELATED APPLICATIONS

This application is the U.S. National Stage of PCT/EP2019/069393, filed Jul. 18, 2019, which in turn claims priority to European patent application number 18184600.7 filed Jul. 20, 2018. The content of these applications are incorporated herein by reference in their entireties.

The invention relates to a device and a method for soldering contact elements with conductor structures onto nonmetallic plates with induction heat.

Modern automobile or architectural glazings often have a variety of electrical functions, such as antennas, electric heaters, or electric lighting elements. These are usually contacted by conductor structures with solder connection surfaces on the plate surface. The conductor structures usually consist of a well-known fired thick film of a screen printing paste with a relatively high silver content.

Subsequently, contact elements are soldered to the conductor structures via a solder. The solder forms an electrical connection and often a mechanical connection as well between the conductor structures and the supply lines that are connected to the contact element.

The soldering operation can be carried out, for example, by a contact soldering method, in which two electrodes with a certain distance between them are placed on the electrically conductive contact element. Then, the contact element is heated by an electric current that flows from one electrode to the other using ohmic resistance heating.

Alternatively, the soldering operation can be carried out by induction soldering. Here, for example, a magnetic field, a high-frequency magnetic field, is coupled into the conductor structure, the solder, and the contact element by a coil situated on the surface of the plate facing away from the conductor structure. This uses the ability of the magnetic field to transfer the energy required to melt the solder through the plate without contact. Such a method is known, for example, from DE 10 2004 057 630 B3.

Other devices or methods for inductive heating or soldering are known, for example, from US 2007/105341 A1 or DE 10 2015 003086 A1.

The object of the present invention is now to specify an improved device for inductively soldering contact elements to conductor structures on plates as well as a method for doing so.

According to the invention, this object is accomplished in terms of the device with the features of claim 1. The method according to the invention is accomplished through the features of another independent claim. The features of the subclaims subordinate in each case to the independent claims indicate advantageous further developments of the invention.

The device according to the invention for inductively soldering at least one ferromagnetic contact element to at least one conductor structure on a nonmetallic plate comprises:
  means for fastening a plate during the soldering operation,
  at least one soldering tool with at least one induction loop or induction coil suitable for emitting a magnetic field,
  means for mutually positioning the soldering tool and the contact element such that the switched-on magnetic field of the soldering tool heats the contact element, at least in sections,
  a generator that is suitable for generating an alternating voltage with a frequency of up to 1500 kHz, preferably of 5 kHz to 1100 kHz and that can be or is connected to the induction loop or induction coil.

In an advantageous further development of the soldering tool according to the invention, the soldering tool includes, apart from the induction loop or induction coil, no components for directing and guiding the field lines of the magnetic field.

In an advantageous embodiment of a soldering tool according to the invention, the induction coil or the induction loop has no magnetic and preferably no soft magnetic material. Soft magnetic materials are ferromagnetic materials and can be readily magnetized in a magnetic field. In particular, the induction loop or induction coil according to the invention has, in its active area, no soft magnetic or ferromagnetic material, except for a soft magnetic component possibly to be soldered, such as a soft magnetic contact element, soft magnetic solder, soft magnetic conductor structures, and/or their supply line(s). Here, the active area is the area into which the induction field radiates for soldering, i.e., the vicinity of the induction loop, in which a component to be soldered can be heated. It goes without saying that the components and structures to be soldered are not part of the induction loop or induction coil according to the invention.

The invention is based on the finding of the inventors that—when using contact elements made of ferromagnetic steel, in particular ferromagnetic stainless steel—it is possible to couple the induction field generated by the soldering tool into the contact element without further guidance of the field lines.

Heat develops in the metallic and in particular ferromagnetic components of the contact element, heating the adjacent solder deposit and the conductor structure adjacent thereto, thus forming a solder joint.

The method according to the invention has the particular advantage that the contact element and the adjacent solder deposit are heated specifically and the vicinity of the conductor structure around the first solder connection surface is, in contrast, heated only slightly. This is particularly advantageous especially in the case of conductor structures made of printed and fired silver prints since these are particularly temperature-sensitive and can become detached from their underlayer (here, in particular, from the nonmetallic plate) in the case of excessive heating.

Contact elements made of ferromagnetic steels with a $\mu_r \gg 1$, preferably stainless ferromagnetic steel, are particularly suitable for this. This group includes in particular ferritic steels and stainless ferritic steels, martensitic steels and stainless martensitic steels as well as duplex steels and stainless duplex steels. Duplex steel is a steel that has a two-phase structure, that consists of a ferrite ($\alpha$-iron) matrix with islands of austenite. The polarization of these steels tends to adapt to the external field, channeling and amplifying it.

It goes without saying that it suffices for the contact element to contain a sufficient amount of ferromagnetic steel. In other words, for example, further thin layers of other materials can also be arranged on the contact element, e.g., for corrosion or rust protection or for improving the electrical conductivity or wettability by a solder. In addition, the contact element can also contain further nonmetallic components, for example, an enclosure made of a temperature-resistant plastic or a ceramic. It is particularly preferred for the contact element to be made entirely of ferromagnetic stainless steel.

The conductor structure on the plate contains a (first) solder connection surface. The contact element contains a (second) solder connection surface. The solder connection surfaces are suitable for forming the solder joint with the solder from a solder deposit.

The heat input occurs primarily via the contact element. In other words, the solder connection surface of the contact element is heated directly. As a result, the solder deposit adjacent the contact element is heated, and not until then is the solder connection surface of the conductor structure on the plate heated. This has several critical advantages. Due to the direct heating of the contact element, the necessary energy applied is used in a very targeted manner, yielding energy savings compared to prior art techniques. Due to the only indirect heating of the solder connection surface on the conductor structure of the plate, it is heated very gently such that there is less damage to the conductor structure and the plate.

It goes without saying that the soldering tool can also have more than one induction coil or induction loop, for example, to solder one contact element to multiple solder connection surfaces (e.g., in a bridge configuration) or to simultaneously solder multiple contact elements next to one another (e.g., in a multi-pole configuration).

The soldering tool is arranged directly adjacent the contact element and thus on the side of the plate facing the solder joint and the conductor structure.

The soldering tool is, in particular, suitable for heating the contact element to or above the soldering temperature of a solder such that a solder deposit adjacent thereto can be melted and soldered to a conductor structure.

In order to achieve consistently high solder quality, it is advantageous to keep the distance between the soldering tool and the contact element as equal as possible with each plate. Here, it is advantageous to provide a very narrow, well-defined air gap, preferably with a gap dimension from 0.1 mm to 5 mm, particularly preferably from 0.25 mm to 5 mm, and in particular from 0.25 mm to 2 mm, between the soldering tool and the contact element, in order to completely avoid contact and electrical short-circuits.

Alternatively, or in combination with an air gap, the soldering tool can also have an electrically insulating intermediate layer or enclosure on its surface facing the contact element, for example, a thermally resistant plastic or a ceramic. It goes without saying that in this configuration, the plate itself does not serve as an intermediate layer.

Alternatively, or in combination with the above, the contact element can also have an electrically insulating intermediate layer or enclosure on its surface facing the soldering tool, for example, made of a thermally resistant plastic or a ceramic.

For series production, the tools can advantageously be installed stationarily in devices or soldering stations in which the plates prepared for producing the solder connections are inserted and positioned. The stationary arrangement of the soldering tools has the further advantage that necessary supply lines do not have to be moved. Alternatively, the soldering tool can be implemented movably, thus enabling more flexible positioning on the plate. In addition, multiple connections can be soldered one after another with one soldering tool.

In an advantageous embodiment of the invention, the device includes at least one counterholder for pressing the contact element onto the plate. In another advantageous embodiment of the invention, the counterholder is combined with gripping tools for positioning the contact elements.

The counterholders or gripping tools are advantageously implemented independent of the soldering tool. There is almost no wear on the soldering tools. Without a soldering tool, counterholders and gripping tools for placing the components to be soldered can be implemented more simply and more compactly and replaced more simply.

Alternative counterholders or gripping tools can advantageously be designed connected to the soldering tool and in particular connected to the induction loop or the induction coil, in particular as an enclosure of the induction loop or the induction coil. For this, counterholders and gripping tools according to the invention are, for example, electrically insulated or made of an electrically insulating material.

During the soldering operation, the connecting parts are pressed only loosely against the plate surface using counterholders and/or gripping tools, which are themselves not heated by the magnetic field. These tools can be made, for example, of plastic or ceramic or both or outfitted with appropriate nonmetallic inserts in the zones of their contact with the soldering pieces. In particular, the counterholders are made only of non-ferromagnetic and, in particular, non-ferritic materials. This can reduce the coupled electrical power required by the induction generator.

In another advantageous embodiment, the device according to the invention contains a robot for guiding and applying the at least one soldering tool to the plate and/or the plate to the soldering tool.

In another advantageous embodiment, the device according to the invention contains a robot for guiding and applying the counterholder and/or gripping tools.

In another advantageous embodiment, the counterholder and/or the gripping tool has no components for directing and guiding the field lines of the magnetic field and, in particular, no ferromagnetic or ferritic components.

In another advantageous embodiment, no components for directing and guiding the field lines of the magnetic field and, in particular, no ferromagnetic or ferritic components are arranged in the vicinity of the solder joint.

In another advantageous embodiment, the frequency range of the induction generator is from 5 kHz to 1100 kHz, preferably from 40 kHz to 1100 kHz, particularly preferably from 400 kHz to 1100 kHz, and in particular from 700 kHz and 1100 kHz. The adjustable output power of the induction generator is advantageously from 200 W to 15 kW and preferably from 400 W to 3 kW.

The plates according to the invention are preferably single panes or composite panes comprising two or more individual panes, as are commonly used in the automotive sector and the construction sector. The single pane or individual panes of the composite pane are preferably made of glass, particularly preferably of soda lime glass, as is customary for window panes. However, the plates can also be made of other types of glass, for example, quartz glass, borosilicate glass, or aluminosilicate glass, or of rigid clear plastic, for example, polycarbonate or polymethyl methacrylate.

The conductor structures can include all types of electrical conductors that can be arranged on a plate and are suitable for soldering. These are in particular printed silver conductors, produced from a printed and subsequently fired thick film of a screen printing paste with a relatively high silver content. Alternatively, metal wires or metal foils glued or otherwise attached can also be used as conductor structures.

Another aspect of the invention includes a system for inductive soldering (also called induction soldering system), comprising:

at least one ferromagnetic contact element, at least one conductor structure, which is arranged on a nonmetallic plate, and a device according to the invention for inductive soldering of the at least one ferromagnetic contact element to the at least one conductor structure on the nonmetallic plate.

Another aspect of the invention comprises a method for soldering at least one ferromagnetic contact element to at least one conductor structure on a nonmetallic plate, wherein a) a nonmetallic plate, preferably made of glass or plastic, having at least one conductor structure arranged thereon and at least one first solder connection surface is provided, b) at least one contact element made of a ferromagnetic steel having at least one second solder connection surface is provided, c) at least one solder deposit is arranged, at least in sections, on the first solder connection surface or the second solder connection surface or on both, d) the second solder connection surface is arranged on the first solder connection surface, wherein the solder deposit is arranged, at least in sections, between the first solder connection surface and the second solder connection surface, e) a magnetic field with a predefined frequency is radiated into the contact element by a soldering tool comprising an electrically powered induction loop or induction coil, in order to heat the contact element by induction and melt the solder deposit adjacent thereto.

In a further process step, the magnetic field is advantageously removed, for example, by switching off the supply voltage or by moving the soldering tool away, whereupon the contact element and the solder cool down and the solder solidifies.

In an advantageous embodiment of the method according to the invention, the frequency of the alternating voltage applied to the induction loop or induction coil is adapted to the connector geometry and set at 1500 kHz.

In an advantageous embodiment of the method according to the invention, the frequency of the magnetic field is in the range from 5 kHz to 1100 kHz, preferably from 40 kHz to 1100 kHz, particularly preferably from 400 kHz to 1100 kHz, and in particular from 700 kHz to 1100 kHz. Such high frequencies of the induction voltage greater than or equal to 400 kHz and in particular greater than or equal to 700 kHz result in a magnetic field with only a small penetration depth. This has the particular advantage that although the contact element, the solder deposit adjacent the second solder connection surface, and thus indirectly also the first solder connection surface of the conductor surface are reliably heated, the conductor structure in the vicinity of the first solder connection surface is heated only slightly. Thus, damage to the conductor structure and detachment of the conductor structure from the plate can be reliably avoided.

The output power of the induction generator is advantageously set in the range from 200 W to 15 kW and preferably from 200 W to 3 kW.

In an advantageous embodiment of the method according to the invention, the soldering tool is applied to the contact element directly and/or via an electrically insulating intermediate layer (which, in particular, is not the plate itself) or with a narrow air gap.

In an advantageous embodiment of the method according to the invention, the contact element is fixed on the plate before and during the soldering using non-ferromagnetic, preferably non-ferromagnetic, nonmetallic counterholders.

In an advantageous embodiment of the method according to the invention, the plate, the contact element, and the at least one soldering tool are stationarily fixed in a device at least during the soldering operation.

In an advantageous embodiment of the method according to the invention, the first solder connection surface of the conductor structure on the plate or the second solder connection surface of the contact element or both are provided with a lead-containing or a lead-free solder deposit, preferably with integrated or subsequently applied flux.

In an advantageous further development of the method according to the invention, the plate, in particular in the region of the solder connection surface, is additionally heated from the side facing away from the soldering tool. For this, the device according to the invention for example, contains a heater. The additional heating reduces temperature-induced stresses in the region of the solder joint and prevents glass breakage or detachment of the conductor structure from the plate. This is particularly advantageous in the case of glass plates, since the adhesion of the conductor structure to the plate is particularly sensitive there.

Further details and advantages of the solution according to the invention are apparent from the accompanying drawings of examples of possible applications and their detailed description.

Figure 2:
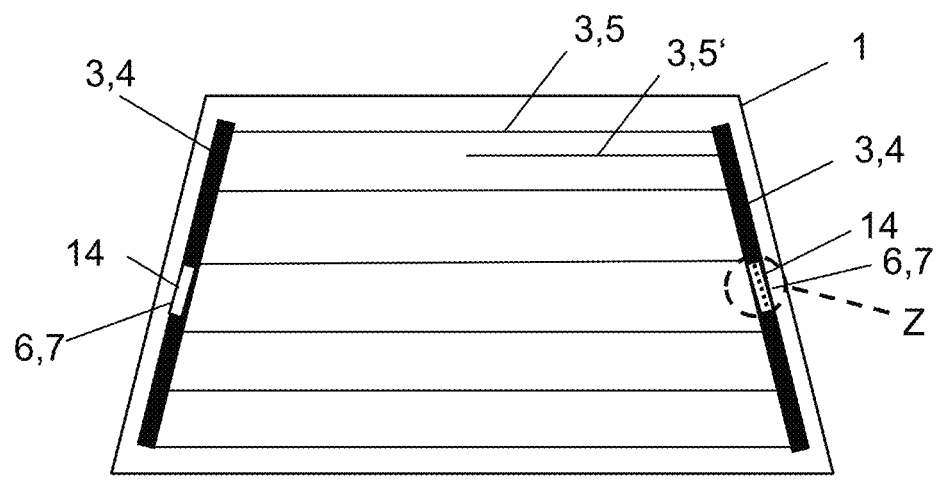

They depict, schematically and not to scale:

FIG. 1 a schematic representation of a device according to the invention with an enlarged detail of a solder joint according to the invention, and FIG. 2 a view of a pane with contact elements according to the invention.

FIG. 1 depicts a schematic representation of a device 100 according to the invention having a soldering tool 13 for soldering a contact element 14 to a conductor structure 3.

FIG. 1 depicts a detail of the pane 1 shown in FIG. 2 based on a cross-sectional representation along the dotted line in the region Z.

FIG. 2 depicts a trapezoidal pane 1 made of glass or plastic, whose upper surface in the viewing direction is provided along its edge with an opaque and, for example, black, electrically nonconductive coating (not shown here, for the sake of simplicity). This is, for example, a rear wall pane of a motor vehicle, shown here simplified without curvature. On its surface, electrical conductor tracks or structures 3, for example, heating conductors 5 and antenna conductors 5' are also provided, which extend over the field of vision of the pane and/or at the edge all the way to the opaque coating. Busbars 4 are provided along the left and right edge of the pane 1. Also, multiple first solder connection surfaces 6 are provided for the electrical contacting of the conductor structures 3 via the busbars 4, which will be discussed in more detail later. Here, a simplified identical mirror-image configuration of busbars and first solder connection surfaces 6 is indicated. However, in reality, the configurations of the busbars and solder connection surfaces can be different depending on the side of the pane. The first solder connection surfaces 6 can also be arranged on the long sides of the pane shape depicted here.

The layout of the heating conductors 5 and antenna conductors 5' in the central field of vision of the pane 1 is shown in simplified form only and absolutely does not restrict the invention. It is, in any case, irrelevant for the present description because this is intended only to discuss the establishing of the electrical connections (at the edges, in this case) of the conductor structures 3 by soldering with inductive heat generation.

The conductor structures 3, the busbars 4, and the first solder connection surfaces 6 are usually produced by (screen) printing a conductive (silver-containing) printing paste in thick-film technology and subsequent firing (on glass panes, preferably during the bending operation).

The pane 1 is inserted into the device 100 that includes, among other things, the soldering tool 13 and means 11 for placing the pane 1 and, optionally, further stops and positioning aids. Here, the support means 11 are, for example, positioned behind/under the pane 1 in the viewing direction; and the soldering tool 13, in front of/above the pane 1. It can, in particular, be seen that the soldering tool 13, which is fixed in the device, is arranged above the first solder connection surface 6 in the vertical projection onto the pane surface.

Also, contact elements 14 are shown. The contact elements 14 have in each case a second solder connection surface 7. This is arranged in the vertical projection onto the pane surface above the first solder connection surface 6. A solder deposit 9 is arranged between the first solder connection surface 6 of the conductor structure 3 of the pane 1 and the second solder connection surface 7 of the contact element 14. After soldering, the solder connection is created between the first solder connection surface 6 and the second solder connection surface 7. Function-appropriate electrical supply lines 19, such as supply lines or connection lines or antenna cables, are connected to the contact elements 14, for example, by crimping, spot welding, screwing, or other connection techniques.

The contact elements 14 contain, for example, a ferromagnetic stainless steel and are substantially made of this material. In other words, the contact element 14 contains at least a core of the ferromagnetic stainless steel. The contact element 14 can, for example, additionally have a sheathing on the surface facing away from the second solder connection point 7, preferably made of a suitable (electrically insulating) plastic. In addition, the contact element 14 can also have, on the surface of the core, thin layers of other, not necessarily ferromagnetic metals, for example, for improved corrosion protection. The special role of the ferromagnetic property of the contact element 14 is discussed further below.

The solder deposit 9 consists of a thin layer of a lead-containing or lead-free solder, optionally with integrated or subsequently applied flux. It can, optionally, suffice to apply a solder deposit 9 on only one of the two surfaces to be soldered in each case, i.e., either on the first solder connection surface 6 or the second solder connection surface 7, if it is ensured that the energy inputted can heat all components sufficiently for good soldering on both sides and the non-tinned surface can be wetted by solder.

The contact element 14, the solder deposit 9, the conductor structure 3, and the pane 1 are depicted here only schematically. This means, in particular, that the thicknesses shown are not to scale.

Here, for example, the contact element 14 is pressed onto the pane 1 by one or a plurality of counterholders 18 and positioned. The counterholders 18 can, for example, and also advantageously, be remotely controlled gripping and positioning tools in an automated production line. They remove the initially loosely movable contact elements 14 from the respective supply magazines, position them on the associated first solder connection surfaces 6, and hold them fixedly during the soldering operation until the solder solidifies.

As shown in FIG. 1, the soldering tool 13 according to the invention is arranged directly above the contact element 14 and, in particular, above the second solder connection surface 7 and the solder deposit 9.

The soldering tool 13 contains (at least) one induction loop 13I or one induction coil that is supplied with an alternating voltage with adjustable frequency and power by a commercial generator 13G. Furthermore, a switch 13S, with which the operation of the induction loop 13I can be controlled, is indicated symbolically in the connection between the generator 13G and the induction loop 13I. Finally, the soldering tool 13 can, if need be, be cooled via tube connections 13C. In deviation from the schematic representation, the supplying of coolant and the electrical supply line are, optionally, combined. For example, the induction loop 13I or induction coil can consist of a hollow metallic tube, through which the coolant flows and which acts at the same time as a high-frequency induction loop. The hollow tube can, for example, be made of silver-plated copper.

Compared to prior art high-frequency induction loops or coils, the soldering tool 13 used here contains coils or loops whose dimensions correspond substantially to the length and width of the contact element 14 above the solder joint 2. The filling of the intermediate spaces in a manner known per se using bodies made of ferrite or other similarly suitable materials is unnecessary. Such ferrite-free soldering tools 13 can be used in combination with ferromagnetic contact elements 14 in a particularly simple, flexible, and energy-saving manner.

As a result of the arrangement of the soldering tool 13 and directly above the ferromagnetic material of the contact element 14, the magnetic field radiated by the induction field is concentrated in or through the contact element 14 and optimized such that it is directed and acts as intensively and concentrated as possible on the solder joints 2. It is thus less important to achieve high homogeneity over large areas than to direct the magnetic field into the specially designed contact element 14. The heating of the contact element 14 results, via the second solder connection surface 7, in a quick and intense heating of the solder deposit 9 and the adjacent first solder connection points 6.

The soldering tool 13 requires no special elements, such as ferrite elements or functionally identical components for shaping and guiding the field lines, as is the case in prior art induction soldering tools. Even the counterholders 18 and other possible components in the vicinity of the soldering tool 13 contain no ferrites or the like. The concentration of the magnetic field on the solder joint 2 is done only via the ferromagnetic contact element 14. This is particularly efficient and energy-saving. At the same time, the soldering tool 13 is particularly flexibly suitable for a variety of connection configurations and does not have to be adapted to the respective contact element 14 as is required in the prior art.

In order to achieve consistently high soldering quality, it is advantageous to keep the distance between the soldering tool 13 and the contact element 14 as nearly the same as possible for each pane. Here, according to the invention, a very narrow, well-defined air gap 17 of, for example, 0.5 mm is provided between the soldering tool 13 and the contact element 14. Such an air gap 17 reliably avoids contact and electrical short circuits completely.

Alternatively, the soldering tool 13 can also have an electrically insulating intermediate layer or enclosure on its surface facing the contact element 14, made, for example, of a thermally resistant plastic or a ceramic.

Alternatively, the contact element 14 can also have an electrically insulating intermediate layer or enclosure on its surface facing the soldering tool 13, made, for example, of a thermally resistant plastic or a ceramic.

The compact soldering tool 13 according to the invention can be implemented to be movable without problems and, for example, can, using robots, be placed with reproducible positions on a pane to be processed. This will be preferred, for example, if no large numbers of always consistent panes are to be processed, or if frequent model changes are to be processed on the same device.

Of course, the soldering tool 13 can also be arranged in a fixed position/stationary in the device 100. The respective pane 1 to be processed is then placed by means of conveyors (not shown) on the support means 11 and moved to the soldering tool 13 with interposition of the contact element 14.

To establish the solder connections, the induction loop 13I is supplied with current or voltage of the desired frequency (for example, of 900 kHz) by switching on its power supply (closing the switch 13S). A typical power in the range from 400 W to 3 kW is set. It goes without saying that the frequency and the power can be varied depending on the distance from the coil or loop, (total) area of the solder joints, and the masses to be heated. The magnetic field penetrates the air gap 17 or any possible intermediate layers without excessive damping. The less air gaps or intermediate layer material, the less damping.

Heat that heats the adjacent solder deposit 9 is generated in the metallic and, in particular, ferromagnetic components of the contact element 14.

A high frequency according to the invention of the induction voltage of more than 400 kHz and, for example, of 900 kHz, results in a magnetic field with only a small penetration depth. This has the particular advantage that although the contact element 14, the solder deposit 9 positioned on the second solder connection surface 7, and, thus, indirectly, also the first solder connection surface 6 of the conductor structure 3 are reliably heated, the conductor structure 3 in the vicinity of the first solder connection surfa will ce 6 is heated only slightly. Thus, damage to the conductor structure 3 and detachment of the conductor structure 3 from the pane 1 are reliably prevented.

The required ON-time of the magnetic field until the complete melting of the solder deposit 9 and the best frequency range can be determined simply and quite reproducibly by tests and also simulated by suitable software. After the soldering operation, the magnetic field is switched off (opening the switch 13S). The pane 1 is still held in place for a short time, as is the counterholder 18, until the solder has solidified and the electrical connections are held in place even without additional mechanical fixation. After that, the pane 1 is fed for further processing.

To optimize the soldering operation and to avoid stresses in the pane 1 and the conductor structure 3, it can be advantageous to preheat the pane 1 together with the conductor structure 3 in the region of the first solder connection point 6 and its vicinity. For this, for example, a heater 20 can be arranged below the pane 1 (i.e., on the side facing away from the soldering tool 13 and the contact element 14).

REFERENCE CHARACTERS

1 plate/pane
2 solder joint
3 conductor structure
4 busbar
5 heating conductor,
5' antenna conductor
6 first solder connection surface
7 second solder connection surface
9 solder deposit
11 support means
13 soldering tool
13C tube connections
13G generator
13I induction loop
13S switch
14 contact element
17 air gap
18 counterholder
19 electrical supply line
20 heater
100 device
Z region

The invention claimed is:

1. A system for inductive soldering, comprising:
at least one ferromagnetic contact element;
at least one conductor structure that is arranged on a nonmetallic plate, and
a device for inductively soldering the at least one ferromagnetic contact element to the at least one conductor structure on the nonmetallic plate, the device comprising:
a support to support the nonmetallic plate during the soldering operation,
at least one soldering tool having at least one induction loop or induction coil adapted to emit a magnetic field, the at least one soldering tool being spaced apart from said support to receive the nonmetallic plate, the at least one ferromagnetic contact element and the at least one conductor structure in a space that extends between said support and said at least one soldering tool,
the at least one soldering tool and the at least one ferromagnetic contact element being positioned relative to each other in said device such that the switched-on magnetic field of the soldering tool heats the at least one ferromagnetic contact element, at least in sections, and said at least one conductor structure and said at least one ferromagnetic contact element are arranged between said nonmetallic plate and said at least one soldering tool during the soldering operation, and
a generator that is adapted to generate an alternating voltage with a frequency of up to 1500 kHz and that can be connected to the induction loop or the induction coil,
wherein, apart from the at least one induction loop or induction coil, the soldering tool includes no components for directing and guiding field lines of the switched-on magnetic field,
wherein dimensions of the at least one induction loop or induction coil correspond to a length and width of the at least one ferromagnetic contact element,
wherein the device includes at least one counterholder for pressing the at least one ferromagnetic contact element onto the nonmetallic plate, the at least one counterholder being arranged adjacent the at least one soldering tool and on a same side as the at least one soldering tool with respect to the at least one ferromagnetic contact element during the soldering operation,
wherein the at least one counterholder is made only of non-ferromagnetic and non-ferritic materials, and wherein the at least one counterholder has no components for directing and guiding field lines of the switched-on magnetic field.

2. The system according to claim 1, wherein the soldering tool includes more than one induction loop or induction coil.

3. The system according to claim 1, wherein the soldering tool is equipped with an electrically insulating intermediate layer for application to the at least one ferromagnetic contact element.

4. The system according to claim 1, wherein the device includes a robot for guiding and applying the at least one soldering tool to the nonmetallic plate and/or the nonmetallic plate to the soldering tool.

5. The system according to claim 1, wherein the counterholder is combined with gripping tools for positioning the at least one ferromagnetic contact element.

6. The system according to claim 5, wherein the gripping tool has no components for directing and guiding field lines of the switched-on magnetic field.

7. A method for inductively soldering the at least one ferromagnetic contact element to the at least one conductor structure on the nonmetallic plate of a system according to claim 1, the method comprising:
a) providing the nonmetallic plate having at least one conductor structure arranged thereon and at least one first solder connection surface,
b) providing the at least one ferromagnetic contact element made of a ferromagnetic steel and having at least one second solder connection surface,
c) arranging at least one solder deposit, at least in sections, on the first solder connection surface or the second solder connection surface or on both,
d) arranging the second solder connection surface on the first solder connection surface, wherein the solder deposit is arranged, at least in sections, between the first solder connection surface and the second solder connection surface,
e) radiating a magnetic field with a predefined frequency by the soldering tool comprising an electrically supplied loop or coil into the contact element, in order to heat it by induction and to melt the solder deposit positioned thereon wherein the at least one ferromagnetic contact element is fixed on the nonmetallic plate before and during the soldering with the aid of the at least one non-ferromagnetic and non-ferritic counterholder, and wherein the at least one counterholder has no ferromagnetic or ferritic components.

8. The method according to claim 7, wherein the frequency of the alternating voltage applied on the induction loop or induction coil is adapted to a connector geometry and is set at 1500 kHz at most.

9. The method according to claim 8, wherein the frequency of the magnetic field is set in the range from 5 kHz to 1100 kHz.

10. The method according to claim 7, wherein the soldering tool is applied to the at least one ferromagnetic contact element directly or via at least one electrically insulating intermediate layer or with an air gap or with a combination of at least one electrically insulating intermediate layer and the air gap.

11. The method according to claim 7, wherein the plate, the at least one ferromagnetic contact element, and the at least one soldering tool are fixed stationarily in the device at least during the soldering operation.

12. The method according to claim 7, wherein the first solder connection surface or the second solder connection surface or both are provided with a lead-containing or lead-free solder deposit.

13. The method according to claim 9, wherein the frequency of the magnetic field is set in the range from 700 kHz and 1100 kHz.

14. The method according to claim 12, wherein the first solder connection surface or the second solder connection surface or both are provided with a lead-containing or lead-free solder deposit with an integrated or subsequently applied flux.

* * * * *